(12) United States Patent
Varhue et al.

(10) Patent No.: US 6,661,075 B2
(45) Date of Patent: Dec. 9, 2003

(54) ABRUPT PN JUNCTION DIODE FORMED USING CHEMICAL VAPOR DEPOSITION PROCESSING

(75) Inventors: Walter J. Varhue, Milton, VT (US); Sean G. Reidy, Burlington, VT (US)

(73) Assignee: The University of Vermont and State Agricultural College, Burlington, VT (US)

(*) Notice: Subject to any disclaimer, the term of this patent is extended or adjusted under 35 U.S.C. 154(b) by 0 days.

(21) Appl. No.: 10/053,985

(22) Filed: Jan. 22, 2002

(65) Prior Publication Data

US 2002/0088972 A1 Jul. 11, 2002

Related U.S. Application Data

(62) Division of application No. 09/598,529, filed on Jun. 21, 2000, now Pat. No. 6,406,929.

(51) Int. Cl.$^7$ ............................................. H01L 23/58
(52) U.S. Cl. ........................................ 257/494; 257/197
(58) Field of Search ......................... 257/19, 77, 197–198, 257/142–143, 492, 494

(56) References Cited

U.S. PATENT DOCUMENTS

| | | | |
|---|---|---|---|
| 4,579,609 A | 4/1986 | Reif et al. | 148/175 |
| 4,659,401 A | 4/1987 | Reif et al. | 148/175 |
| 4,870,030 A | 9/1989 | Markunas et al. | 437/81 |
| 4,906,328 A | 3/1990 | Freeman et al. | 156/643 |
| 5,092,937 A | 3/1992 | Ogura et al. | 134/30 |
| 5,298,452 A | 3/1994 | Meyerson | 437/81 |
| 5,621,227 A | * 4/1997 | Joshi | 257/184 |
| 5,906,680 A | 5/1999 | Meyerson | 117/88 |
| 5,915,187 A | 6/1999 | Huisman et al. | 438/379 |
| 5,920,795 A | 7/1999 | Suzuki | 438/680 |
| 5,977,569 A | * 11/1999 | Li | 257/119 |
| 6,049,098 A | * 4/2000 | Sato | 257/198 |
| 6,064,081 A | 5/2000 | Robinson et al. | 257/183 |
| 6,210,988 B1 | 4/2001 | Howe et al. | 438/50 |

OTHER PUBLICATIONS

B.S. Meyerson et al. "Bistable conditions for low–temperature silicon epitaxy;"Sep. 3, 1990; Appl. Phys. Lett. vol. 57, No. 10; pp. 1034–1036.

T. Takahagi et al. "Control of the chemical reactivity of a silicon single–crystal surface using the chemical modification technique"; Sep. 1, 1990; J. Appl. Phys. Vol 68, No. 5; pp. 2187–2191.

(List continued on next page.)

Primary Examiner—David Nelms
Assistant Examiner—David Vu
(74) Attorney, Agent, or Firm—Downs Rachlin Martin PLLC (57) ABSTRACT

A pn junction diode (250) having its metallurgical junction of the oppositely-doped regions (254, 256) coincident with the surface WS of an electrically-doped wafer W and a method of forming such a diode. The method includes preparing (202) the wafer surface prior to placing the wafer into a reaction chamber (14). The preparation of the wafer surface includes UV ozonation (102d) and hydrogen-termination (102e) in a hydrofluoric acid solution. After the wafer surface is prepared, the wafer is inserted into the reaction chamber and heated to a temperature of less than 650° C. Without delay, a pn junction (252) is formed by growing on the wafer surface an epitaxial film layer having a doping opposite the doping of the wafer. The doped film layer is grown (204) by plasma-enhanced chemical vapor deposition while simultaneously introducing dopant atoms into the reaction chamber. After the film layer has been grown, a mesa structure (257) is etched (206), the diode is passivated (208) and electrical contacts (258, 260) are formed (210) on the oppositely-doped regions of the pn junction.

12 Claims, 7 Drawing Sheets

OTHER PUBLICATIONS

D.B. Fenner "Silicon surface passivation by hydrogen termination: A comparative study of preparation methods"; Jul. 1, 1989; J. Appl. Phys. vol. 66, No. 1; pp. 419–424.

I. Nagai et al. "Epitaxial growth of silicon at low temperature by ultrahigh vacuum electron cyclotron resonance plasma chemical vapor deposition"; Nov. 15, 1988; J. Appl. Phys. vol. 64, No. 10; pp. 5183–5188.

T. Takahagi et al. "The formation of hydrogen passivated silicon single–crystal surfaces using ultraviolet cleaning and HF etching"; Oct. 1, 1988; J. Appl. Phys. vol. 64, No. 7; pp. 3516–3521.

T. N. Nguyen et al. "Characterization of IC Devices Fabricated in low temperature (550° C.) epitaxy by UHV/CVD Technique"; Feb. 1986; IEDM 86; pp. 304–307.

B.S. Meyerson "Low–temperature silicon epitaxy by ultra-high vacuum/chemical vapor deposition"; Mar. 24, 1986; Appl. Phys. Lett., vol. 48, No. 12; pp. 797–799.

\* cited by examiner

ABRUPT PN JUNCTION DIODE FORMED USING CHEMICAL VAPOR DEPOSITION PROCESSING

PRIOR APPLICATION INFORMATION

This is a divisional application of U.S. patent application Ser. No. 09/598,529, filed Jun. 21, 2000, now U.S. Pat. No. 6,406,929.

FIELD OF THE INVENTION

The invention relates to forming a pn junction in a semiconductor structure and, in particular, to forming a hyper-abrupt pn junction by low-temperature growth of a doped film on a surface of an oppositely doped substrate wherein the metallurgical junction of the pn junction could coincide with the surface of the substrate.

BACKGROUND OF THE INVENTION

The pn junction is the basic building block of most semiconductor devices. It is possible to fabricate these structures by a number of processes that are familiar to those working in the semiconductor industry. Briefly, such techniques used to produce pn junctions include thermal diffusion, ion implantation and epitaxial growth. The present invention is directed to pn junctions formed by growth of epitaxial layers taking the form of any one of silicon (Si), germanium (Ge), silicon germanium ($Si_xGe_{1-x}$), or silicon germanium carbide ($Si_xGe_yC_{1-x-y}$), which are used extensively in the production of silicon-based microelectronic devices.

A Si epitaxial layer is typically deposited, or grown, on a Si substrate by high temperature pyrolysis of a chlorosilane precursor, such as dichlorosilane, or at a low temperature if silane ($SiH_4$) is the precursor. Another approach is to deposit this layer by molecular beam epitaxy (MBE). MBE produces well behaved, i.e., abrupt, pn junctions, but the practicality of MBE is limited due to its extreme vacuum requirements and very low growth rates.

A commercially viable alternative to MBE is Plasma-Enhanced Chemical Vapor Deposition (PECVD), which has the potential to reduce the substrate temperature required for growing an epitaxial layer for forming a pn junction. To date, however, it is believed PECVD has not produced a properly operating pn junction in which the initial growth surface is contained in the depletion layer or located at the metallurgical junction of the oppositely-doped materials and the doping concentration of the least doped side is greater than $10^{16}$ $cm^{-3}$.

In general, the gaseous discharge associated with PECVD assists in creating the precursors to film growth, such as SiH, $SiH_2$ and $SiH_3$, and also assists in removing impediments to film growth, e.g., hydrogen on the substrate surface. The movement of chemical species on the growth surface is enhanced by the energetic particle flux to the surface, which in general assists in the overall growth process. It is known that growing epitaxial layers at lower substrate temperatures reduces unwanted autodoping, dopant diffusion and the creation of crystal defects. The ability to epitaxially deposit Si-based and Ge-based films at reduced substrate temperatures would improve the quality of semiconductor devices, would simplify the process used to fabricate such devices and would make possible the fabrication of new device structures. Implicit in this capability to fabricate devices is the ability to chemically alter or dope the material with impurity atoms of n or p type. The ability to spatially alternate the placement of these dopant atoms in adjacent regions is required for the construction of a pn junction. There is considerable benefit to the ability to incorporate these dopants at low substrate temperatures that reduce unwanted autodoping and dopant diffusion that degrade the abruptness of a pn junction.

Currently there is considerable interest in growing $Si_xGe_{1-x}$ and $Si_xGe_yC_{1-x-y}$ alloys for producing heterojunction devices. Successful epitaxial growth of these heteroepitaxial alloys on Si substrates requires that low substrate temperatures (i.e., below 650° C.) be used to avoid relaxation of the pseudomorphic crystal structure. Unfortunately, the growth rate at such low substrate temperatures is presently quite small, on the order of 50 Å/minute.

The ability to deposit doped epitaxial semiconductor films is a critical technology required in fabricating integrated circuits. It has long been recognized that the ability to deposit semiconductor epitaxial films at reduced substrate temperatures will be required for the fabrication of subsequent generations of integrated circuit devices. Low substrate temperature epitaxial growth of semiconductor films is expected to eliminate or reduce the problems associated with autodoping, dopant diffusion and microcrystalline defect generation in addition to permitting the deposition process to be performed outside of thermal equilibrium. These advantages would result in a reduction in linewidth and junction depth of present device designs, and would permit the fabrication of new device structures currently limited by high processing temperatures.

The ability to grow epitaxial semiconductor films at reduced substrate temperatures using plasma enhanced processes has been demonstrated in numerous investigations. The exact role of the plasma in the deposition process has been attributed to a number of factors, as described in the article by W. J. Varhue, J. L. Rogers, P. S. Andry, E. Adams, M. Lavoie and R. Kontra, entitled "Low temperature deposition of epitaxial Si," Solid State Technology, 163 June (1996). These factors include: production of reactive species which are the precursor to film growth, the removal of adsorbed hydrogen from the growth surface which prevents the adsorption of growth species on the surface, and the increase in adatom surface mobility to lower the required deposition temperature.

Despite the anticipated ability of plasma-enhanced processes to potentially produce hyper-abrupt ($10^{24}$ $atoms/cm^4$) pn junction structures at lower substrate temperatures, such processes have failed to be successful. Problems associated with the electrical performance of pn junction diodes fabricated by this process have caused concern. The problems are a consequence of interfacial defects that occur at the original wafer surface where the deposition was first initiated.

The defects in the original surface of the substrate are believed to be both chemical and physical in nature and are an artifact of the fabrication process. In the case of the PECVD growth process, the surface has historically been prepared by a combination of ex-situ and in-situ processes. The in-situ process typically involves a plasma-enhanced mechanism which generates either an energetic ion or free radical hydrogen flux onto the substrate surface. It is believed that both of these particle fluxes damage or activate interfacial electrical defects on the wafer surface that then compromise the electrical properties of the diode.

Figure 1:
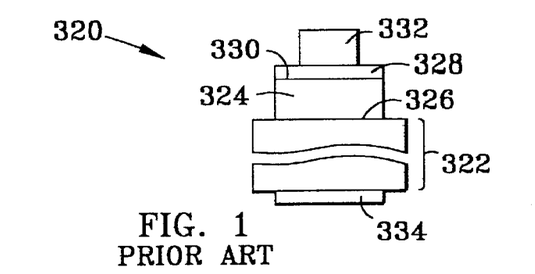
FIG. 1 is a cross-sectional view of a prior art pn junction diode.

One solution has been to grow a thick epitaxial layer of the same doping composition as the substrate. This effectively removes the substrate surface from the depletion layer of the device. FIG. 1 shows a conventional pn junction diode 320 formed by PECVD and comprising a p-doped substrate 322 and a thick p-doped epitaxial layer 324 deposited onto original surface 326 of substrate 322. After epitaxial layer 324 is deposited, the dopant is changed from p-type to n-type, and thereafter an n-doped layer 328 is deposited. Epitaxial layer 324 allows the metallurgical junction 330 between the oppositely-doped layers 324, 328 to be formed remote from defects present on original surface 326 that interfere with the normal electrical function of diode 320. After the epitaxial layer 324 has been deposited, metal contacts 332, 334 are formed, respectively, on the upper surface of epitaxial layer 324 and the lower surface of substrate 322 to complete diode 320.

Until the present invention, a properly functioning diode could be made using PECVD only by either restricting the doping concentration of the least doped side to $10^{16}$ cm$^{-3}$ or by first depositing a film with a doping concentration similar to the substrate. The effect of either of these conditions is to eliminate the possibility of trap-assisted tunneling. In the first case, the depletion region is widened to the point that this leakage mechanism is rendered negligible. In the second case, the effect is to move the metallurgical junction away from the defected initial wafer surface. Growing the additional layer adds a step to the process of forming a pn junction, a step which increases the time, and hence cost, it takes to form the junction and reduces the design flexibility for fabricating device structures.

SUMMARY OF THE INVENTION

One aspect of the present invention is a pn junction diode containing a depletion region. The diode includes a substrate and a chemical vapor deposited epitaxial layer. The substrate includes one of Si and Ge, has a surface and is doped with a first dopant of either a p-type or an n-type. At least a portion of the chemical vapor deposited epitaxial layer is doped with a second dopant of a type opposite the first dopant such that the surface of the substrate is contained within the depletion region.

Another aspect of the present invention is a pn junction diode comprising a substrate having a surface and a chemical vapor deposited epitaxial layer. The substrate is doped with a first dopant type of a first doping concentration. The chemical vapor deposited layer is doped with a second dopant type of a second doping concentration. The second dopant type is opposite the first dopant type and the second doping concentration is lower than the first doping concentration.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE INVENTION

The present invention is a process for fabricating a hyper-abrupt, substantially trap-free pn junction on a doped substrate using an epitaxial-PECVD method to grow Si, Ge, $Si_xGe_{1-x}$ and $Si_xGe_yC_{1-x-y}$ films at low substrate temperatures, i.e., below 650° C. The process makes it possible to place the metallurgical junction directly at the wafer surface and permits the growth of films of any doping concentrations, including doping concentrations in which the least doped side is greater than $10^{16}$ cm$^{-3}$.

The present process has been developed for use in an electron cyclotron resonance (ECR) PECVD reactor. However, the deposition conditions are also possible in other chemical vapor deposition apparatus, including various plasma reactor configurations, such as helicon, parallel plate, transformer coupled, helical resonator, magnetically enhanced, remote PECVD and the like, where the control of substrate biasing can duplicate the conditions described hereinbelow.

Figure 2:
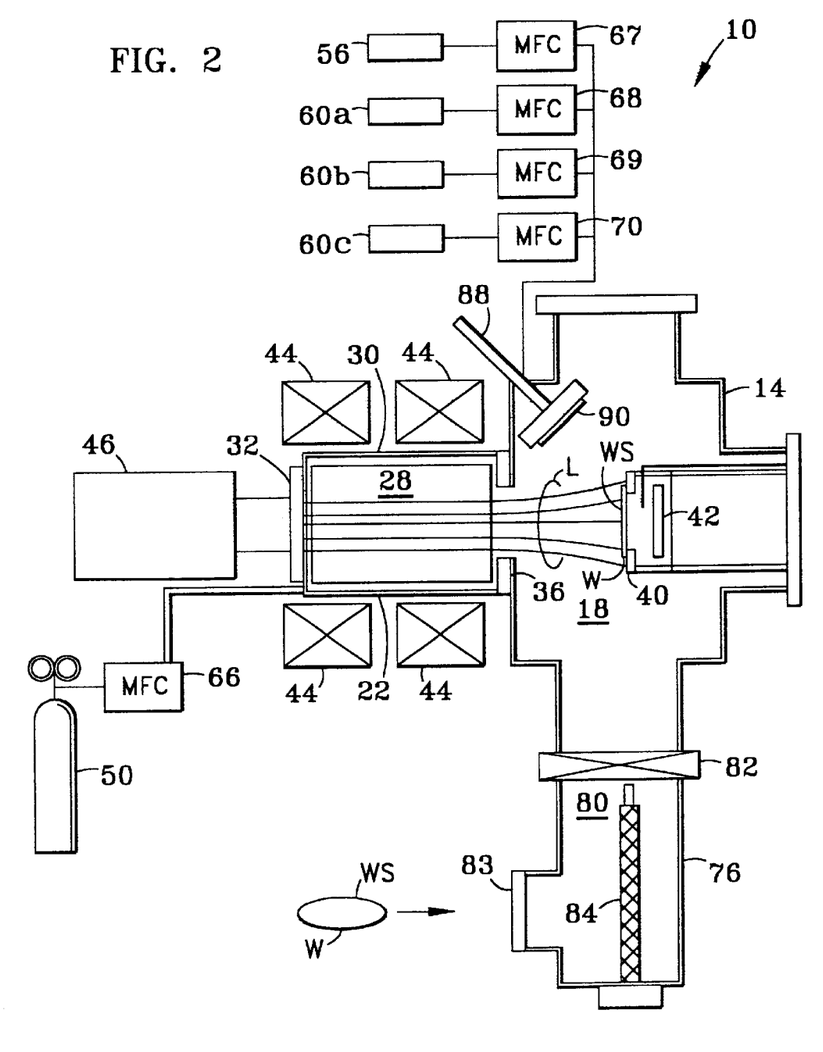
FIG. 2 is cross-sectional schematic diagram of the ECR-PECVD reactor apparatus used to practice a process according to the present invention.

With reference to FIG. 2, reactor apparatus 10 comprises a primary reaction chamber 14 enclosing a primary interior region 18, and a secondary elongate chamber 22 enclosing a secondary interior region 28 open to region 18. A quartz liner (not shown) is preferably provided in chamber 22. The latter also includes an outer wall 30 and an end portion 32 made of quartz. A gas ring 36 is located between regions 18 and 28. Apparatus 10 further includes within region 18 a substrate holder 40 capable of holding a wafer W or other substrate having a surface WS, and a radiative heater 42 arranged adjacent the substrate holder so as to be able to heat the wafer. Radiative heater 42 may be, for example, a boron-nitride coated radiative heater. Wafer W is preferably made of Si for growing Si-based films and is preferably made of Ge for growing Ge-based films. Ge-based films may also be grown on a suitably-designed buffer layer on a Si substrate or grown as an alloy with Si or C on Si.

Apparatus 10 further includes DC magnets 44 surrounding outer wall 30 of chamber 22, and a microwave radiation source 46 outside of chamber 14 and adjacent end portion 32. When activated, magnets 44 produce magnetic field lines L, as shown. Also included in apparatus 10 is an argon (Ar) gas source 50 in fluid communication with interior regions 18 and 28, and a hydrogen (H$_2$) gas source 56 in fluid communication with interior region 18. Further included is a silane gas source 60a, germane gas source 60b, and methane gas source 60c, each in fluid communication with interior region 18. Mass flow controllers 66–70 are included between each of gas sources 50, 56 and 60a–60c, respectively, and the interior regions with which each respective gas source is in fluid communication.

With continuing reference to FIG. 2, apparatus 10 further includes a load-lock chamber 76 connected to main chamber 14. Load-lock chamber 76 has an interior region 80 separated from interior region 18 by a gate valve 82. Chamber 76 includes a load lock door 83 for allowing placement of wafer W within interior region 80, and a load lock arm 84 for holding and loading the substrate onto wafer holder 40. Apparatus 10 also preferably includes a RF sputter gun 88 arranged in chamber 14. RF sputter gun 88 includes a sputtering target 90 which faces wafer surface WS of substrate W. Sputtering target 90 may be made of Sb or other suitable material for doping the film to be deposited on surface WS of wafer W.

Figure 3:
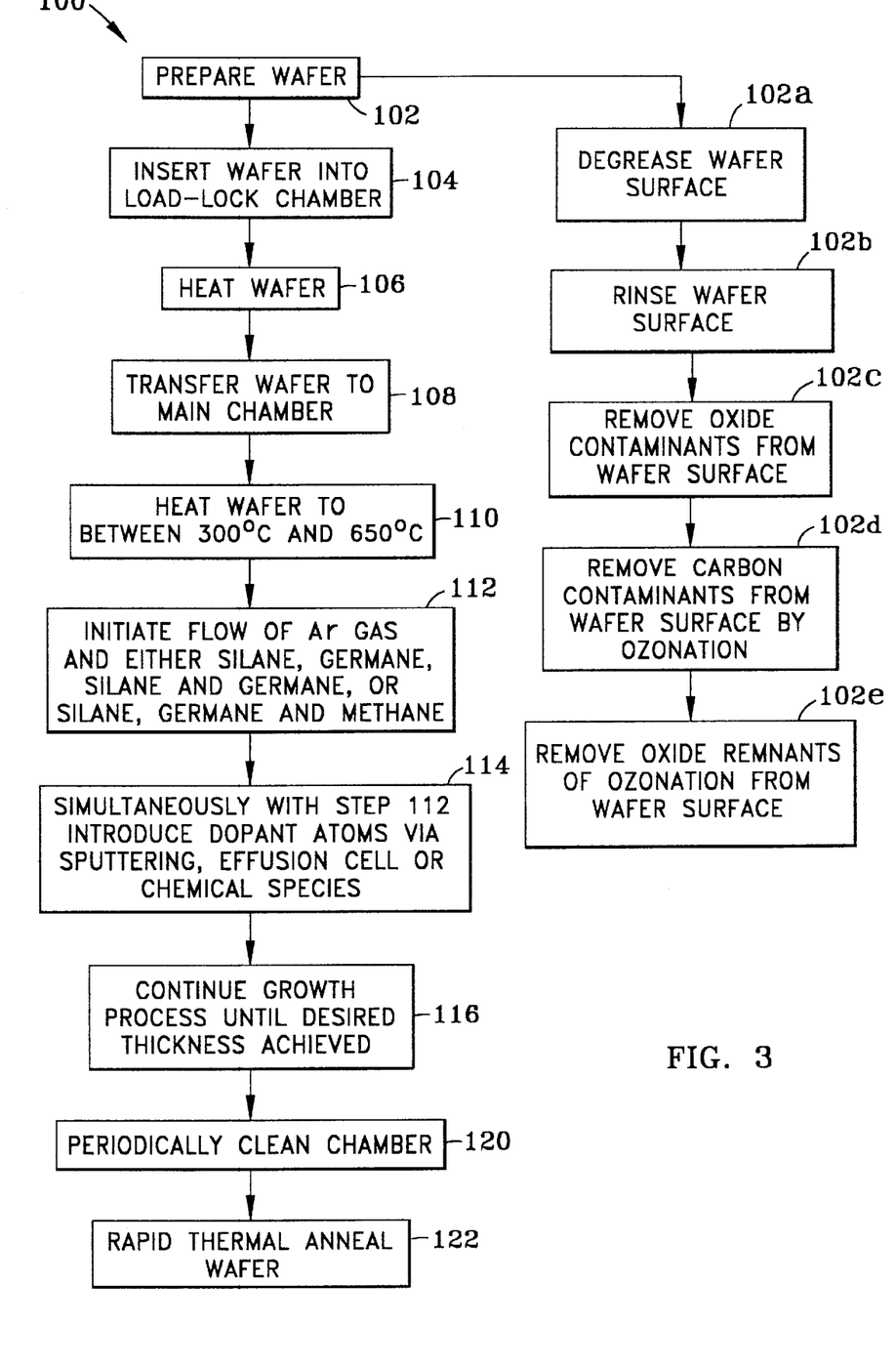
FIG. 3 is a flow diagram of the steps for epitaxially growing a doped epitaxial Si film, a doped Ge film, a doped $Si_xGe_{1-x}$ film or a doped $Si_xGe_yC_{1-x-y}$ film according to the present invention.

General Process for Growing a Doped Si, Ge, $Si_xGe_{1-x}$ and $Si_xGe_yC_{1-x-y}$ Epitaxial Layer With reference to apparatus 10 of FIG. 2, and also to flow diagram 100 and steps 102–116 of FIG. 3, the process of fabricating an epitaxially grown Si, Ge, $Si_xGe_{1-x}$ or $Si_xGe_yC_{1-x-y}$ diode on doped wafer W according to the present invention is now described. Although the process is described for wafer W, one skilled in the art will appreciate that the process may be used with any doped substrate having a substantial amount of oxygen and carbon on the surface that receives the oppositely-doped epitaxial layer.

First, in step 102, wafer W is prepared. This preparation includes cleaning surface WS such that it is free of most carbon-containing (organic) contaminants. The preparation also includes substantially hydrogen-terminating surface WS, meaning that a layer of hydrogen atoms is site-absorbed to the atoms of the wafer material at wafer surface WS. The preparation may be accomplished using one of a number of different techniques, including an ozonation/deoxidation process that uses an ozonation step to substantially remove the organic contaminants present on wafer surface WS and subsequent deoxidation step to remove the oxide layer remaining on wafer surface WS following ozonation.

A preferred technique for preparing wafer W is presented in steps 102a–e of FIG. 3. First, wafer W is degreased in step 102a using, for example, trichloroethylene or acetone. Next, in step 102b, wafer is rinsed in ethanol and then deionized water to remove remnants from step 102a. Steps 102a and 102b may be eliminated, depending on whether or not a particular wafer needs to be degreased.

Next, in step 102c, wafer W is etched by submersing it in a dilute solution of hydrofluoric acid to remove the native oxide layer from wafer surface WS. Preferably, the strength of the solution should be from approximately 0.5% to approximately 10%. For the diodes reported in the experimental results below, the solution strength was about 5%. It is desirable that the hydrofluoric acid solution be composed of deionized and organic-free water. Preferably the water has a resistivity of at least 18MΩ cm and a total organic carbon (TOC) content as low as possible.

The water used in the preparation and cleaning of the wafers used to form the diodes that produced the results reported hereinbelow was purchased from the Transene Co., Inc. of Danvers, Mass. The water was prepared by passing it through a number of consecutive filtering systems manufactured by the Millipore Corporation of Bedford, Mass. First the water was passed through a sediment and carbon filter. The product of this treatment was then passed through a reverse osmosis filter and subjected to a combined electrodialysis and ion exchange cartridge filtration. Next the water was directed through an Organex-Q™ cartridge to remove organic contaminants. The last two treatments were repeated in an additional set of cartridges and finally the water was filtered in a 0.2 micron filter to remove particulate material gathered during the purification process.

Next, in step 102d, wafer surface WS is ozonated by exposing it to UV radiation in air or other oxygen-containing environment. The UV radiation produces ozone that reacts with, and either volatilizes or vitrifies, the carbon-containing contamination on wafer surface WS. Although UV ozonation is preferred, other methods of ozonation, such as placing wafer W into a chamber filled with ozone from an ozone generator or the like, may be used. In step 102e, wafer surface WS is deoxidized by re-immersing wafer W in an ultra-pure HF solution, which is preferably of the same strength as hydrofluoric acid solution for step 102c.

Next, in step 104, the clean wafer W is inserted into region 80 of load lock chamber 76 through load lock door 83. With load lock door 83 and gate valve 82 closed, load lock chamber 76 is evacuated, preferably to a pressure of about $10^{-5}$ Torr.

Then, at optional step 106, wafer W is heated to between about 200° C. and 400° C., and preferably to between about 250° C. and about 300° C., in load lock chamber 76 to remove excess water vapor that may have deposited on wafer surface WS.

Next, in step 108, wafer W is transferred from region 80 in loadlock chamber 76 to interior region 18 of primary reaction chamber 14 and is placed in substrate holder 40. During this step, it is preferable to flow inert gas into region 18 to limit the flow of other gases from the load-lock chamber into this region. At this point, chamber 14 is continuously being pumped down to the desired vacuum level, preferably about $5 \times 10^{-7}$ Torr or lower.

Next, in step 110, wafer W is radiatively heated via heater 42 to a temperature of between about 300° C. and 650° C.

Next, in step 112, the actual process of growing a Si, Ge, $Si_xGe_{1-x}$ or $Si_xGe_yC_{1-x-y}$ film on wafer surface WS using PECVD begins without delay. For the ECR apparatus 10, this is accomplished by flowing one or more precursor gases from one or a combination of gas sources 60a–60c and flowing the Ar carrier gas from Ar gas source 50 to interior region 18 while supplying microwave power from microwave radiation source 46. As mentioned above, other PECVD apparatus may be used. Optimal operating parameters for such alternative apparatuses may be determined empirically.

For growing a Ge film, germane gas is flowed from gas source 60b. For growing a Si film, silane gas is flowed from gas source 60a. For growing a $Si_xGe_{1-x}$ film, silane and germane are flowed from gas sources 60a and 60b at a suitable ratio such as 5:1. For growing $Si_xGe_yC_{1-x-y}$, methane gas is also flowed from gas source 60c at a suitable ratio such as 5:1:20. At the same time, dopant atoms of either p or n type are introduced into the deposited film, for example, by sputtering, effusion or inflow of a gas containing the desired dopant. A preferred rate of hydride gas flow from sources 60a–60c is between 2 and 20 sccm, and a preferred flow rate of argon is about 50 sccm.

The composition of the film can be controlled by the relative composition, or ratio, of hydride gases supplied to the chamber. Other characteristics of the hydride gases, such as the relative ease with which reactive radicals are produced by collision with energetic electrons in the discharge also affect this ratio. For example when depositing a $Si_xGe_{1-x}$ alloy, a silane to germane ratio of (5:1) will produce a film with a Si to Ge ratio of (14:1).

At step 114, dopant atoms are introduced into interior region 18 simultaneously with step 112. The dopant atoms may be introduced by sputtering, an effusion cell or flowing a gas containing a chemical species of the desired dopant atom into interior region 18. For example, if a p-type dopant is required, the dopant atoms may be B, Al or In. Alternatively, if an n-type dopant is required, the dopant atoms may be P, Sb or As.

The doping concentration in the resulting film depends on the growth rate of the semiconductor materials and the incorporation rate of the dopant atoms. The film growth rate using the process of the present invention depends mainly on the temperature of wafer W, the microwave power of microwave radiation source 42 and the feed gas flow rates. The doping concentration depends on the delivery rate of dopant atoms to the substrate surface. In this present embodiment, the delivery rate is determined by the power supplied to the sputter targets. If an effusion cell is used, the delivery rate will depend upon the temperature and if a gaseous source is used, the delivery rate will depend upon the flow rate and composition of the gas. The resulting doping concentration is inversely proportional to the growth rate of the deposited film. In general, the microwave power levels should preferably be between 150 W and 350 W. Higher microwave power levels may be used, but the flow of reactive gas and delivery rate of dopant atoms need to be increased accordingly.

With reference again to FIG. 3, in the next step 116, the film growth is continued under the operating conditions of choice within the parameters as described above until a desired film thickness is achieved. The parameters for growing a Ge film are similar to those described above for Si.

Chamber 14 needs to be periodically cleaned of residual particles that are residue of the film growing process. Accordingly, in step 120, the chamber is cleaned, preferably by operating the Ar ECR plasma with addition of a fluorine or hydrogen-containing gas such as $NF_3$ or $H_2$. The period of this cleaning cycle is on the order of minutes, depending on the frequency and duration of use of apparatus 10.

Improvements in the thin film material quality may be obtained by the addition of a post deposition thermal anneal process step. In this connection, in step 122, wafer W is exposed to a rapid thermal annealing step wherein the temperature is preferably 1100° C.

Mechanism for Process of Growing Doped Si, Ge, $Si_xGe_{1-x}$ and $Si_xGe_yC_{1-x-y}$ Films The mechanism for the process of growing Si, Ge, $Si_xGe_{1-x}$ and $Si_xGe_yC_{1-x-y}$ films according to the PECVD process of the present invention is believed to have two key components. For growing Si-based films, the first is the production of reactive species ($SiH$, $SiH_2$, and $SiH_3$) from silane by the plasma discharge. For growing Ge-based films, the reactive species $GeH$, $GeH_2$, and $GeH_3$ are formed from germane. These species are the precursors to film growth. The second is that the energetic ion flux at the growth surface increases the successful utilization of these available reactive chemical species in the growth of an epitaxial film. Accordingly, energetic ion bombardment of the growth surface is an important aspect for the film growth process of the present invention. The energetic ion flux (in units of eV) can be characterized as being on the same order of magnitude as the arrival rate of adatoms to the growth surface. The ion energy/adatom flux ratio required for epitaxial growth is influenced by the substrate temperature, growth rate, vacuum level and alloy composition of the deposited thin film material.

The incorporation of dopant atoms into the film material also benefits from the PECVD process. The dopants can be added at higher concentrations and at lower temperatures without the problems associated with the formation of additional chemical phases or diffusion.

Process for Making a pn Junction

Figure 4:
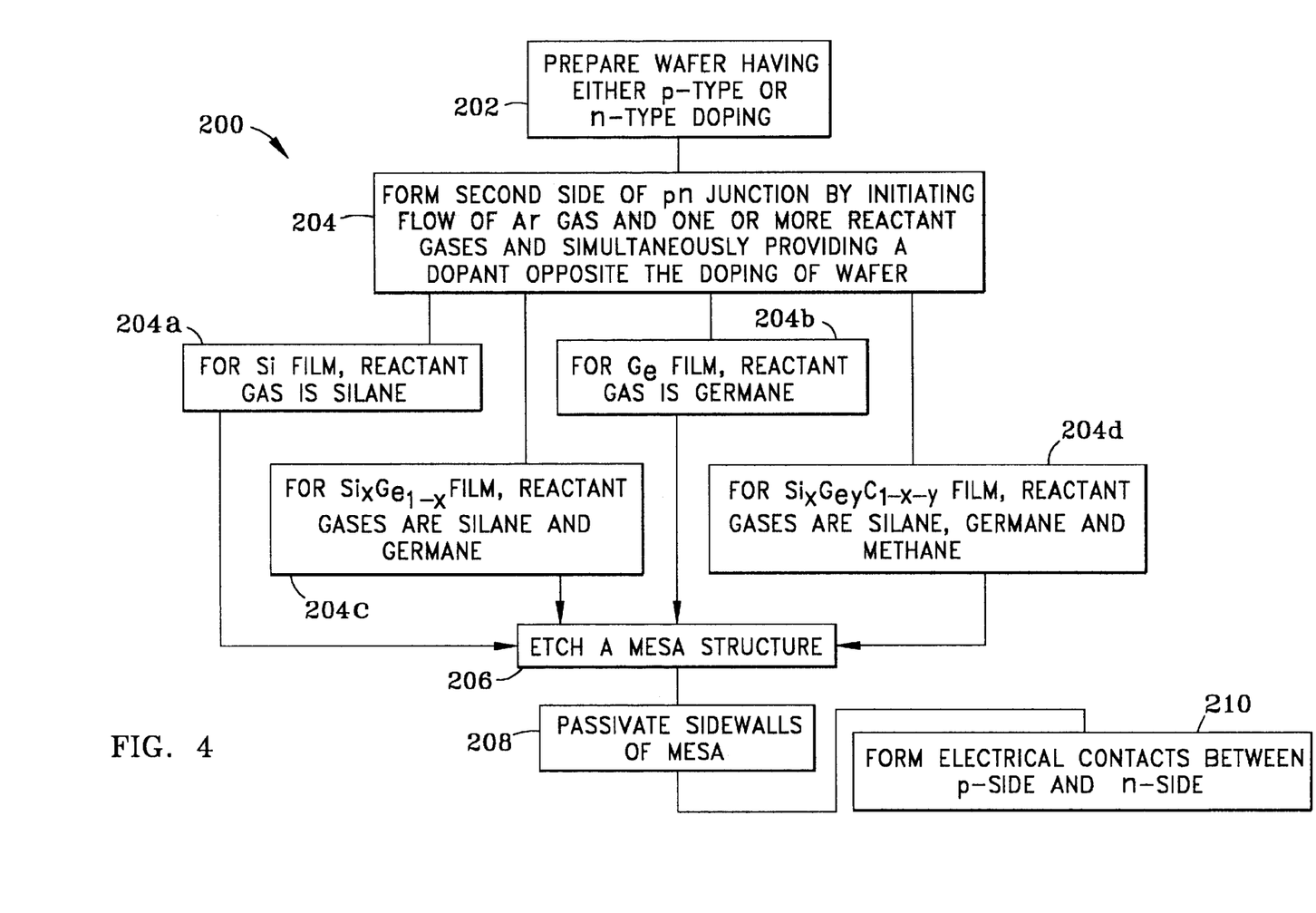
FIG. 4 is a flow diagram of the process steps for making a pn junction according to the present invention.
Figure 5:
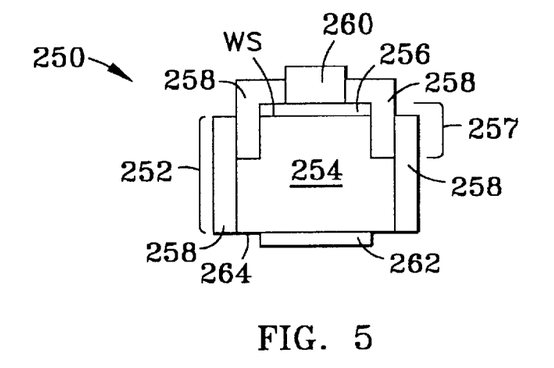
FIG. 5 is a cross-sectional view of a pn junction diode fabricated using the process steps set forth in FIG. 5.

With reference to apparatus 10 of FIG. 2, and also to flow diagram 200, steps 202–206 of FIG. 4 and also to FIG. 5, the process of making a pn junction diode 250 according to the present invention is now described.

For fabricating a pn junction having the metallurgical junction of the oppositely doped regions coincident with wafer surface WS, wafer W must be either p-type doped or n-type doped, depending upon whether a "pn" layering or an "np" layering is desired.

First, in step 202, a wafer W is prepared for the start of epitaxial growth in the reactor chamber. Preparation step 202 includes steps 102 through 110, described above in connection with flow diagram 100 of FIG. 3. An important component of the present invention is that wafer W be inserted into interior region 18 of chamber 14 while it is substantially contaminant free and hydrogen-terminated. Thus, an effective cleaning procedure, such as the one described in steps 102a–102e above, is important to producing a properly functioning diode.

In step 204, the actual process of growing an electrically-doped Si, Ge, $Si_xGe_{1-x}$ or $Si_xGe_yC_{1-x-y}$ film on wafer surface WS should be begun after step 202 without delay. This is accomplished by initiating the flow of gas from gas sources 60a–60c and the flow of Ar from Ar gas source 50 to interior region 18. For growing a Si film, silane gas is flowed from gas source 60b (step 204a). For growing a Ge film, germane gas is flowed from gas source 60b (step 204b). For growing a $Si_xGe_{1-x}$ film, silane and germane are flowed from gas sources 60a and 60b at a desired ratio (step 204c). For growing $Si_xGe_yC_{1-x-y}$, methane gas is also flowed from gas source 60c at a desired ratio (step 204d).

If wafer W is doped with an n-type dopant, a p-type dopant may be added to the film while it is being grown on wafer surface WS. This can be accomplished, for example, by sputtering during film growth using a sputtering target containing B, Al or In. A preferred RF sputtering gun 88 is 1.5 inches in diameter and is operated at 2 W to 15 W of power. The resulting doping concentration depends on the growth rate of the film and the power supplied to the sputtering gun. As stated above, alternative means for introducing the dopant into the film include effusion using an effusion cell and flowing a dopant-containing gas into interior region 18.

For fabricating a pn junction on the wafer surface when wafer W is doped with a p-type dopant, a n-type dopant is added while the film is being grown. This can be accomplished, for example, by sputtering during film growth using a sputtering target containing P, Sb or As. Again, the resulting dopant concentration depends upon the film growth rate and power supplied to the sputtering gun. The operation is ended when the desired film thickness has been deposited onto wafer surface WS.

In FIG. 5, diode 250 includes a pn junction 252 having a first region 254 corresponding to doped wafer W and a second region 256 corresponding to the epitaxial film layer grown on wafer surface WS and doped opposite to first region 254. As described above, first region 254 may be either p-doped or n-doped. If first region 254 is n-doped, second region 256 is doped with p-type dopant atoms during growth of the epitaxial film layer. Similarly, if first region 254 is p-doped, second region 256 is doped with an n-type dopant during growth of the epitaxial film layer. In an alternative embodiment, wherein the metallurgical junction is beyond original wafer surface WS, the epitaxial film layer may be initially grown using the same dopant type present in wafer W. Then, while epitaxial film layer is being grown, the dopant type is changed to the dopant type opposite that of wafer W to form the second region of the junction remote from wafer surface WS.

After pn junction 252 is formed according the above-described process, wafer W is removed from reactor apparatus 10 and step 206, the forming of a mesa structure 257, is accomplished in a manner known in the art, such as using photolithography and a suitable etchant. Then, in step 208, the sidewalls of mesa structure 257 is passivated using a method known in the art, such as plasma-depositing silicon dioxide ($SiO_2$) or the like, to form a passivation layer 258. Passivation layer 258 protects diode 250 from indiffusion of foreign elements that may corrupt the electrical properties of the materials of regions 254, 256 and interfere with the proper functioning of the diode. Passivation layer 258 also neutralizes electrically active states on the sidewalls of diode 250 that would otherwise conduct electricity. Although an oxide passivation layer is preferred, other passivation layers known in the art may be used.

Next, in step 210, a first electrical contact 260 and a second electrical contact 262 are formed, respectively, onto the upper surface of second region 256 and the lower surface of first region 254 in a manner known in the art, such as thermal-evaporation deposition. The material for contacts 260, 262 depends on the doping of the region adjacent to the corresponding contact. For an n-type doping, gold or silver is used. For a p-type doping, aluminum or indium is used.

It will be apparent to one skilled in the art that the present invention will permit the fabrication of pn device structures, such as heterojunction bipolar transistors, that are limited by thermal equilibrium and diffusion.

Experimental Results

Figure 6:
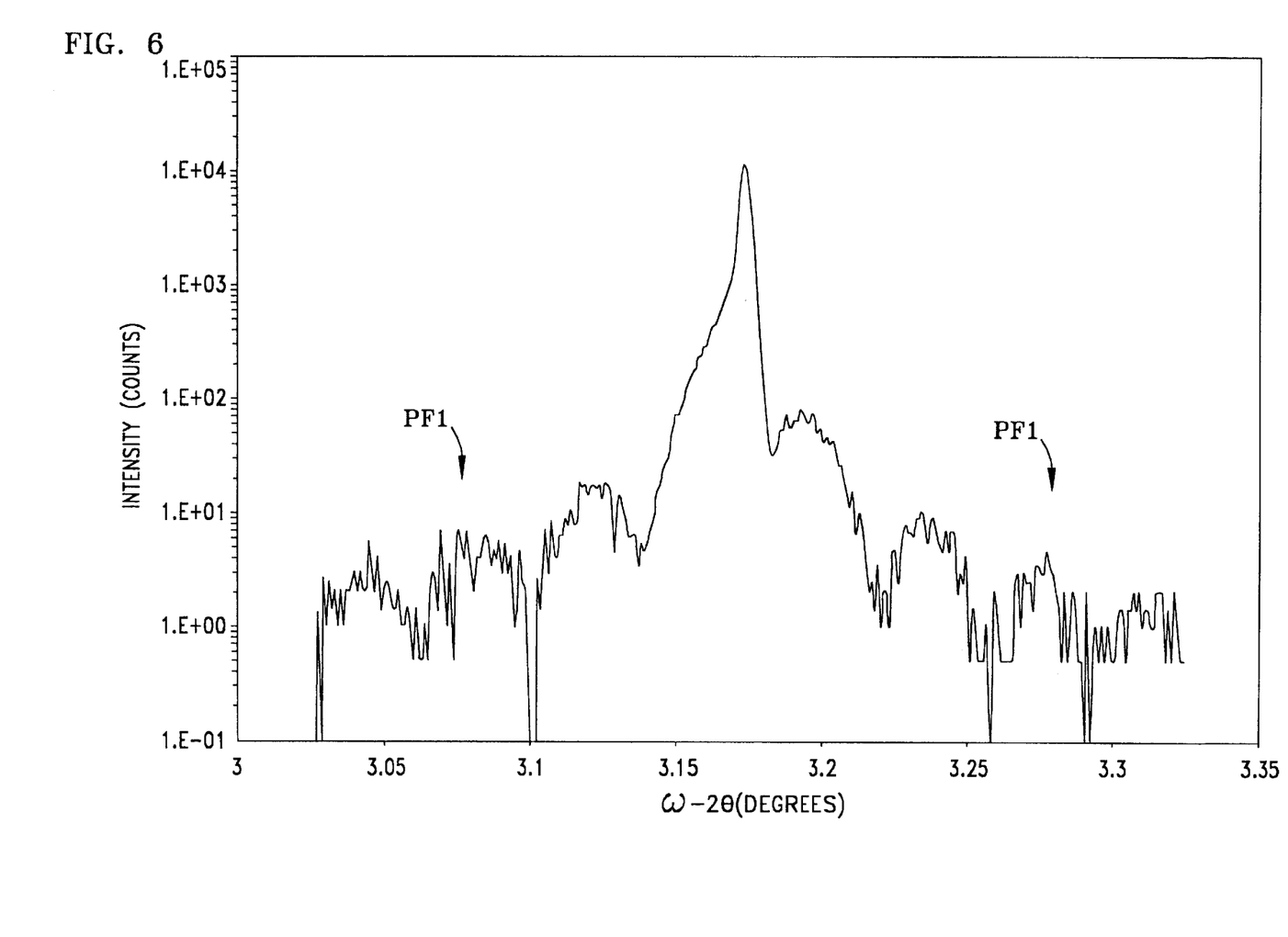
FIG. 6 is an x-ray rocking curve spectrum for an epitaxial Si sample prepared using a process according to the present invention and at the following conditions: microwave power of 200 W; substrate temperature of 500° C.; silane flow rate of 5.25 sccm; and an Ar flow rate of 30 sccm upstream and 40 sccm downstream, which resulted in a deposition rate of 100 Å/min.

The crystalline quality of a doped epitaxial layer may be measured by high resolution x-ray diffraction. An x-ray diffraction spectrum is shown in FIG. 6 for a lightly doped film grown using the above process. The best indication of crystalline quality from such a measurement is the presence of Pendellosung fringes PF1, which are clearly present in this spectrum.

An important measure of the quality of a semiconductor material is the material's ability to produce properly-functioning electronic devices. Since the process of the present invention may be used to fabricate a pn junction device having the metallurgical junction between oppositely doped regions at the original wafer surface, the condition of the wafer surface is critical to the proper performance of the device. A measure of the quality of the wafer surface is the reverse-bias leakage current density.

Figure 7:
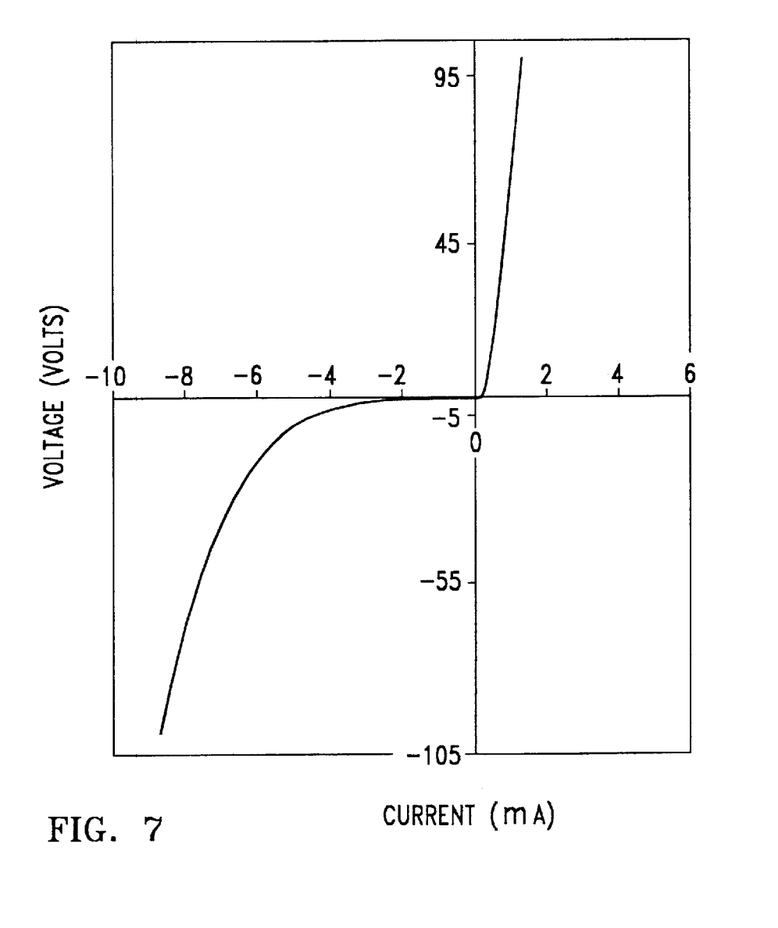
FIG. 7 is a plot of the characteristic I-V curve measured for a pn junction diode fabricated on a p$^+$ type wafer using a process according to the present invention and having a high n-type doping concentration.

The above-described process was used to fabricate a pn junction diode by sputtering Sb from an RF driven sputtering target 90 during the growth of the epitaxial film layer on a heavily-doped p-type substrate. Target 90 was operated at a power level of 15 W. Results from previous investigations using this apparatus indicate that the doping level of this film is approximately $3 \times 10^{19}$ $cm^{-3}$. The current-voltage curve C1 resulting from the electrical characterization of this diode is shown in FIG. 7. Curve C1 is clearly that of a properly-functioning pn junction diode. The reverse bias current density measured at a voltage that is approximately 15% of the breakdown strength expected for a film with this doping concentration was $5 \times 10^{-3}$ $A/cm^2$. Due to the fact that the doping concentration in both the substrate and epitaxial film are high, the behavior operative in reverse bias is that of band-to-band tunneling.

At this point in the analysis of experimental results it is not possible to eliminate the possibility that current transport is also a result of trap-assisted tunneling. A likely source of traps are those that might exist on the initial wafer surface, which in this case is also the metallurgical junction.

Figure 8:
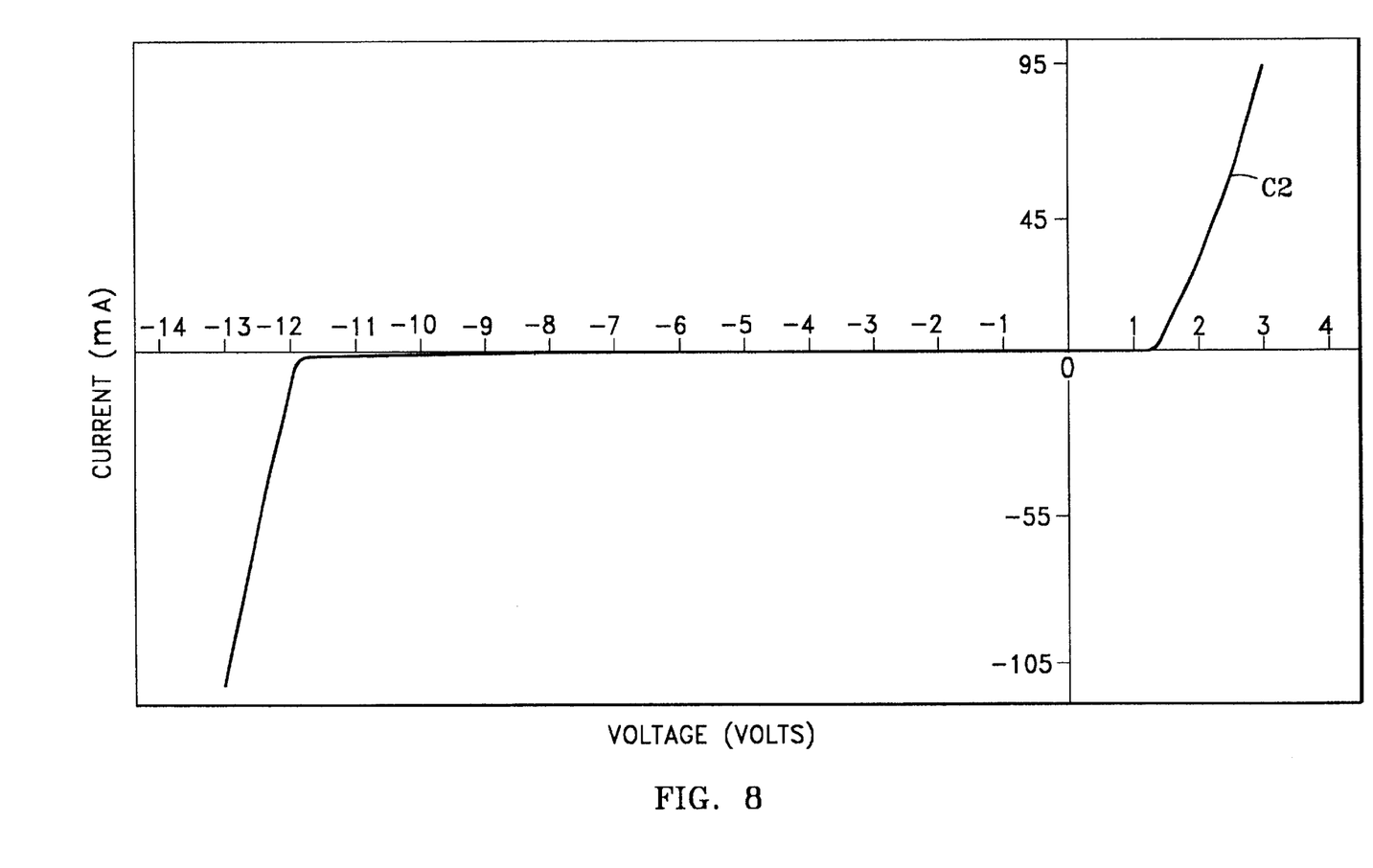
FIG. 8 is a plot of the characteristic I-V curve measured for a pn junction diode fabricated on a p$^{++}$ type wafer using a process according to the present invention and having a low n-type doping concentration.

A second example of an electrical characterization of a pn junction diode fabricated using the process of the present invention is shown as curve C2 in FIG. 8. In this case, the pn junction was formed on a heavily-doped ($1 \times 10^{19}$ $cm^{-3}$) p-type wafer. The doping of the n-type epitaxial layer was accomplished by sputtering from an Sb target while growing the layer. The doping concentration is estimated to be on the order of $5 \times 10^{17}$ $cm^{-3}$. The important aspects to note from curve C2 are its sharp forward bias slope and the long width of the reverse bias shelf. The width of the reverse bias shelf is a consequence of the doping concentration in the film. More significantly, the gradual slope of the reverse bias shelf indicated little leakage current.

The concentration of the doping on the lighter doped side is too low to support band-to-band tunneling. The concentration, however, is such that trap-assisted tunneling could occur if traps or electrical defects were present. To test this hypothesis, a similarly doped device was fabricated using a slightly different process and then electrically characterized. For this case, the wafer surface was treated to a 5 second hydrogen plasma cleaning step immediately preceding growth of the epitaxial layer. The plasma cleaning step was performed by operating the ECR discharge at a microwave power level of 200 W and a pressure of 5 mTorr. The gas flow rate during this period included the addition of 20 sccm of hydrogen at the downstream gas inlet from hydrogen gas source 56. The argon flow rate from argon gas source 50 to the upstream location was 30 sccm, which is similar to the flow rate used during the standard film growth process.

The reverse-bias leakage current density of the first sample, measured at a voltage of approximately 15% of the breakdown voltage expected for a film with this doping concentration ($5 \times 10^{17}$ $cm^{-3}$), was $6.5 \times 10^{-4}$ $A/cm^2$, while for the hydrogen plasma cleaned device the leakage at this voltage was 0.4 $A/cm^2$. The cause of the higher current density in the second sample was the presence of defects caused by the plasma cleaning of the wafer surface, which corresponds to the metallurgical junction.

Figure 9:
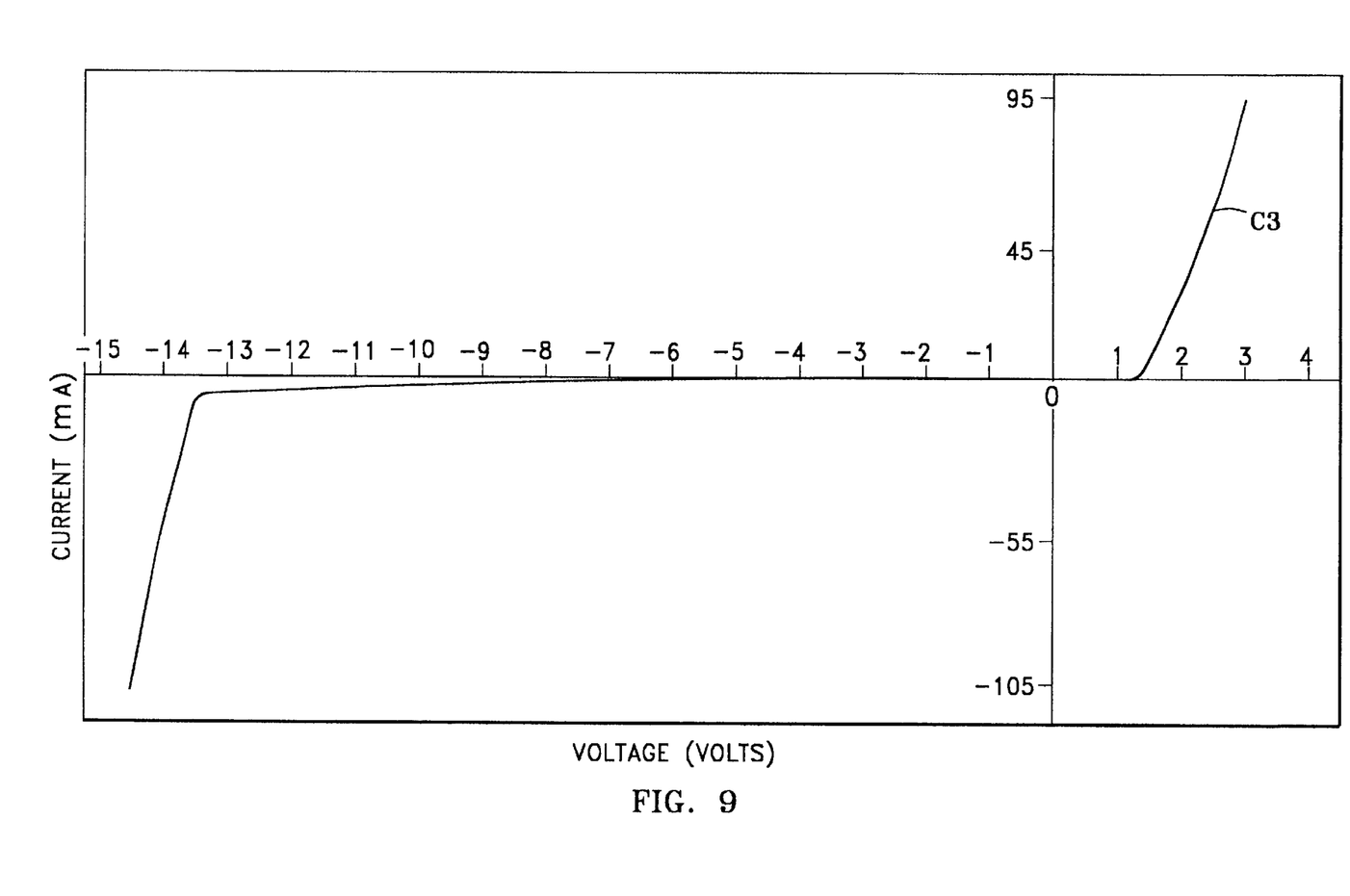
FIG. 9 is a plot of the characteristic I-V curve measure for a p-i-n structure fabricated on a p$^{++}$ type wafer using a process according to the present invention and having an intrinsic region approximately 200 nm wide.

The performance of a third device example is illustrated by curve C3 in FIG. 9 for the case of a p-i-n structure fabricated on a heavily-doped ($5 \times 10^{19}$ $cm^{-3}$) p-type wafer. The n-type epitaxial film layer was formed by sputtering from an Sb target during growth. The intrinsic, or i region, is approximately 200 nm wide. In accordance with the present invention, the initial wafer surface is coincident with the growth of the intrinsic region. The dopant concentration in the n-type epitaxial layer is estimated to be on the order of $1 \times 10^{19}$ $cm^{-3}$. The important aspects of this curve are its sharp forward-bias slope, the relatively long width of the reverse-bias shelf and the low level of saturated reverse bias current.

The width of the intrinsic region in this device structure (200 nm) is insufficient to prevent the possibility of trap-assisted tunneling. No reverse bias trap assisted tunneling current is observed in the characterization of this device and, therefore, is further evidence of the success of this process to produce PN junction diodes without electrically active interfacial defects.

An advantage of the process of the present invention is its ability to produce properly-functioning pn junction devices having the original wafer surface contained within the depletion region. This ability permits the diodes to be fabricated at any doping concentration, without concern for trap-assisted tunneling. Formerly, this problem was avoided by fabricating diodes where either one side of the junction was doped less than $10^{16}$ cm$^{-3}$ or the metallurgical junction was moved from the wafer surface by first growing a film of a similar doping type and concentration as the substrate.

The present invention may also be used to produce properly-functioning devices having their metallurgical junctions coincident with the wafer surface. Such devices heretofore could only be made using MBE, a high-vacuum, slow-growth process that is not practical for commercial manufacturing of pn junction devices. In contrast, the process of the present invention is a relatively low-vacuum, fast-growth process readily adaptable to large scale manufacturing. Moreover, by permitting the metallurgical junction to be placed at the wafer surface, the process of the present invention eliminates the necessity to grow an epitaxial layer having a relatively thick region of the same doping type as the wafer as is required by conventional relatively fast-growth processes. Eliminating growth of such a region reduces manufacturing time and cost.

Another advantage of the process of the present invention is its ability to grow an epitaxial layer on a doped substrate wherein the relative doping concentrations between the epitaxial layer and the substrate may be any desired. Such versatility of relative doping concentrations allows a device designer to engineer the characteristics of the depletion region, which determines the optical and electrical performance of a device, as a part of the epitaxial growth process.

Yet another advantage of the process of the present invention is its ability to produce a hyper-abrupt pn junction. The above-described process may be performed at a temperature lower than that which causes significant diffusion of dopant atoms across the metallurgical junction to occur.

While the present invention has been described in terms of preferred embodiments and working examples, it should be understood that it is not so limited. On the contrary, it is intended to cover all alternatives, modifications and equivalents as may be included within the spirit and scope of the invention as defined in the appended claims.

What is claimed is:

1. A pn junction diode having a breakdown voltage, comprising:
   a. an active pn junction including a first side, a second side and a metallurgical junction between said first and second sides, said active pn junction having a leakage current density of no greater than $1 \times 10^{-2}$ A/cm$^2$ at a reverse-bias voltage of approximately 15% of the breakdown voltage of the pn junction diode;
   b. a substrate including one of Si and Ge, said substrate having a cleaned surface cleaned to remove contamination from exposure to air and being doped with a first dopant of either a p-type or an n-type so as to form said first side of said active pn junction; and
   c. a chemical vapor deposited epitaxial layer deposited onto said cleaned surface at least a portion of said chemical vapor deposited epitaxial layer being doped with a second dopant of a type opposite said first dopant so as to form said second side of said active pn junction such that said cleaned surface of said substrate is coincident with said metallurgical junction of said active pn junction.

2. A pn junction diode according to claim 1, wherein said leakage current density is no greater than $8 \times 10^{-4}$ A/cm$^2$ at said reverse-bias voltage of approximately 15% of the breakdown voltage.

3. A pn junction diode according to claim 1, wherein said chemical vapor deposited epitaxial layer is a plasma-enhanced chemical vapor deposited layer.

4. A pn junction diode according to claim 1, wherein said substrate is a wafer having an original surface, said cleaned surface corresponding to said original surface.

5. A pn junction diode according to claim 1, wherein said cleaned surface of said substrate is hydrogen-terminated prior to being placed into a chemical vapor deposition chamber in which said chemical vapor deposited epitaxial layer is grown.

6. A pn junction diode according to claim 1, wherein said substrate comprises an epitaxial layer.

7. A pn junction diode according to claim 1, wherein said cleaned surface of said substrate has substantially no electrically active interfacial defects.

8. A pn junction diode having a breakdown voltage, comprising:
   a. an active pn junction including a first side, a second side and a metallurgical junction between said first and second sides, said active pn junction having a leakage current density of no greater than $1 \times 10^{-2}$ A/cm$^2$ at a reverse-bias voltage of approximately 15% of the breakdown voltage of the pn junction diode;
   b. a substrate having a cleaned surface, said substrate doped with a first dopant type of a first doping concentration, said substrate forming said first side of said active pn junction; and
   c. a chemical vapor deposited epitaxial layer deposited onto said cleaned surface, said chemical vapor deposited epitaxial layer doped with a second dopant type of a second doping concentration so as to form said second side of said pn junction such that said metallurgical junction of said active pn junction diode is coincident with said cleaned surface, said second dopant type being opposite said first dopant type and said second doping concentration being lower than said first doping concentration.

9. A pn junction diode according to claim 8, wherein said leakage current density is no greater than $8 \times 10^{-4}$ A/cm$^2$ at a said reverse-bias voltage of approximately 15% of the breakdown voltage.

10. A pn junction diode according to claim 8, wherein said cleaned surface of said substrate has substantially no electrically active interfacial defects.

11. A pn junction diode according to claim 8, wherein said chemical vapor deposited epitaxial layer is a plasma-enhanced chemical vapor deposited layer.

12. A pn junction diode according to claim 8, wherein said second doping concentration is at least $10^{16}$/cm$^3$.

* * * * *

UNITED STATES PATENT AND TRADEMARK OFFICE
CERTIFICATE OF CORRECTION

PATENT NO. : 6,661,075 B2
DATED : December 9, 2003
INVENTOR(S) : Varhue et al.

It is certified that error appears in the above-identified patent and that said Letters Patent is hereby corrected as shown below:

Column 12,
Line 2, insert -- , -- between the words "surface" and "at".
Line 53, delete "a" between the words "at" and "said".

Signed and Sealed this

Fifteenth Day of June, 2004

JON W. DUDAS
*Acting Director of the United States Patent and Trademark Office*